United States Patent [19]

Andrews

[11] Patent Number: 4,517,486
[45] Date of Patent: May 14, 1985

[54] MONOLITIC BAND-PASS FILTER USING PIEZOELECTRIC CANTILEVERS

[75] Inventor: Angus P. Andrews, Westlake Village, Calif.

[73] Assignee: The United States of America as represented by the Secretary of the Army, Washington, D.C.

[21] Appl. No.: 582,195

[22] Filed: Feb. 21, 1984

[51] Int. Cl.³ ............................................. H01L 41/08
[52] U.S. Cl. .................................. 310/331; 310/321; 310/365; 310/311; 333/186
[58] Field of Search ................ 310/311, 321, 330–332, 310/364, 365, 334; 333/186–192, 200

[56] References Cited

U.S. PATENT DOCUMENTS

| | | | |
|---|---|---|---|
| 3,354,413 | 11/1967 | Ko .................................... | 310/321 X |
| 3,488,530 | 1/1970 | Staudte ........................... | 310/321 X |
| 3,509,387 | 4/1970 | Thorn et al. ....................... | 310/321 |
| 3,566,166 | 2/1971 | Borner .............................. | 310/321 |
| 3,590,287 | 6/1971 | Berlincourt et al. ................ | 310/321 |
| 3,634,787 | 1/1972 | Newell ............................. | 310/321 X |
| 3,686,593 | 8/1972 | Zakaria ........................... | 310/321 X |
| 3,896,401 | 7/1975 | Yano et al. ....................... | 310/321 X |

*Primary Examiner*—Mark O. Budd
*Attorney, Agent, or Firm*—Anthony T. Lane; Robert P. Gibson; Robert C. Sims

[57] ABSTRACT

The device is made by growing thin-film layers of materials on a silicon substrate. These layers are then removed selectively by photolitographic masking and etching, to produce a pattern which is a series of cantilever plates which are piezoelectrically coupled. An electrical signal connected to a first pattern of piezoelectric material will cause the associated plate to deflect. A second piezoelectric pattern on each plate will generate an electrical signal due to the strain caused by deflection of the plate, and this signal is transferred to a first piezoelectric pattern on the next plate, and so on down to the last plate where the signal is extracted.

2 Claims, 7 Drawing Figures

MONOLITIC BAND-PASS FILTER USING PIEZOELECTRIC CANTILEVERS

DEDICATORY CLAUSE

The invention described herein was made in the course of or under a contract or subcontract thereunder with the Government and may be manufactured, used, and licensed by or for the Government for governmental purposes without the payment to me of any royalties thereon.

SUMMARY OF THE INVENTION

Thin-film layers of material are grown on a silicon substrate. Portions of these layers are then removed selectively by photolitographic masking and etching, to produce a pattern which is a series of cantilever plates (or beams) which are piezoelectrically coupled. An electrical signal will cause a plate to deflect, due to strain in a first pattern of piezoelectric material on the plate. An independent or second pattern or piezoelectric material on each beam will generate an electrical signal due to the strain caused by deflection of the plate, and this signal is transferred electrically to a first piezoelectric pattern on the next plate. The resonanting frequencies of the individual plates can be controlled by controlling their dimensions, and the piezoelectric patterns can be designed to couple mechanically into the fundamental (lowest-frequency) vibration modes of each plate. The signal can be amplified, if necessary, between plates. The composite signal transfer characteristics of this device can be made to be a band-pass filter with flat response in the frequencies passed and with sharp attenuation outside the band.

DESCRIPTION OF THE BEST MODE AND PREFERRED EMBODIMENTS

Figure 1:
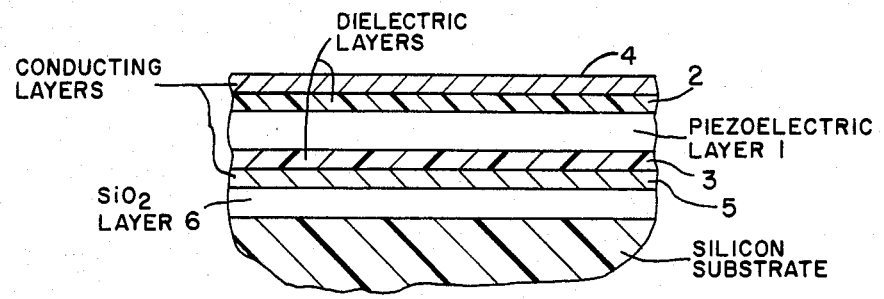
FIG. 1 is an illustration of the layers of materials.

FIG. 1 shows the layers which are grown on a silicon substrate. The piezoelectric layer 1 is sandwiched by dielectric layers 2 and 3 and conducting layers 4 and 5. A silicon oxide layer 6 is interposed between the silicon substrate and the conducting layer 5.

The layers are etched in the following order, using mask patterns similar to those shown in the accompanying FIG. 5. A thermally-grown oxide is etched inside the "comb" FIG. 1 (Mask A-1), then the oxide is used for a mask for anisotropic etching of the silicon under the beams. The metallization layer 5 is etched away outside the pattern shown in Mask A-2. This forms the bottom conducting layers in all piezoelectric capacitors. A piezoelectric film is deposited after this metallization layer has been patterned. A thin dielectric film may be deposited over the piezoelectric layer, also the second metallization layer 4 is patterned using Mask A-3. Note that this is identical to Mask A-2, except for the terminating contact pads. Finally, "windows" are opened through the piezoelectric film, exposing the contact pads for the bottom metallization layer. The pattern of these windows is shown in Mask A-4. All conducting layers are etched. The piezoelectric layer is etched to expose contact pads on the bottom conducting layer. A thermal oxide layer 7 (FIG. 4) is etched to form an oxide mask for etching the beams.

Figures 2, 3:
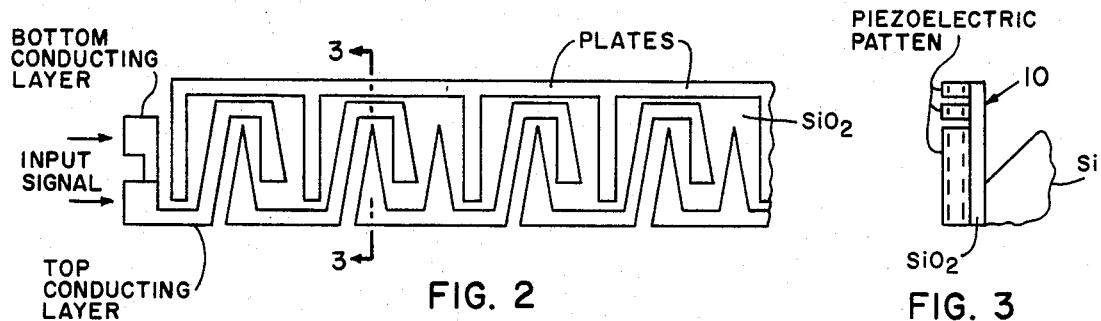
FIG. 2 is an illustration of the pattern produced.
FIG. 3 is a side view of FIG. 2 taken along section line 8-A.
Figure 6:
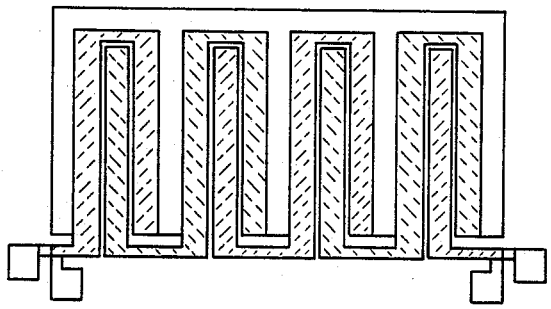
FIG. 6 illustrates the patterns of the piezoelectric capacitors.

FIGS. 2 and 3 show the patterns developed and how the plates are undercut by the anisotropic etch of the silicon. Beams are coupled in series by pairs of piezoelectric capacitors, shown in shaded in the rectangle embodiment of FIG. 6. Each beam has a pair of piezoelectric capacitors, arranged symmetrically about its median line. Each piezoelectric capacitor couples strain in the plane of the piezoelectric layer to a voltage signal between its conducting layers. At each stage, the input signal on one piezoelectric capacitor induces stress in the piezoelectric layer, which causes the beam to deflect. The shapes of the capacitors may be designed to assure better coupling into specific vibration modes of the beam. The resulting vibration of the beam induces an electrical signal in the second piezoelectric capacitor. The output of the second piezoelectric capacitor is electrically coupled to the input capacitor of the next beam in the series, . . . and so on. Each "beam" is a rectangular plate which is attached along one edge to the silicon substrate. It can be considered mechanically as a cantilever beam.

Figure 4:
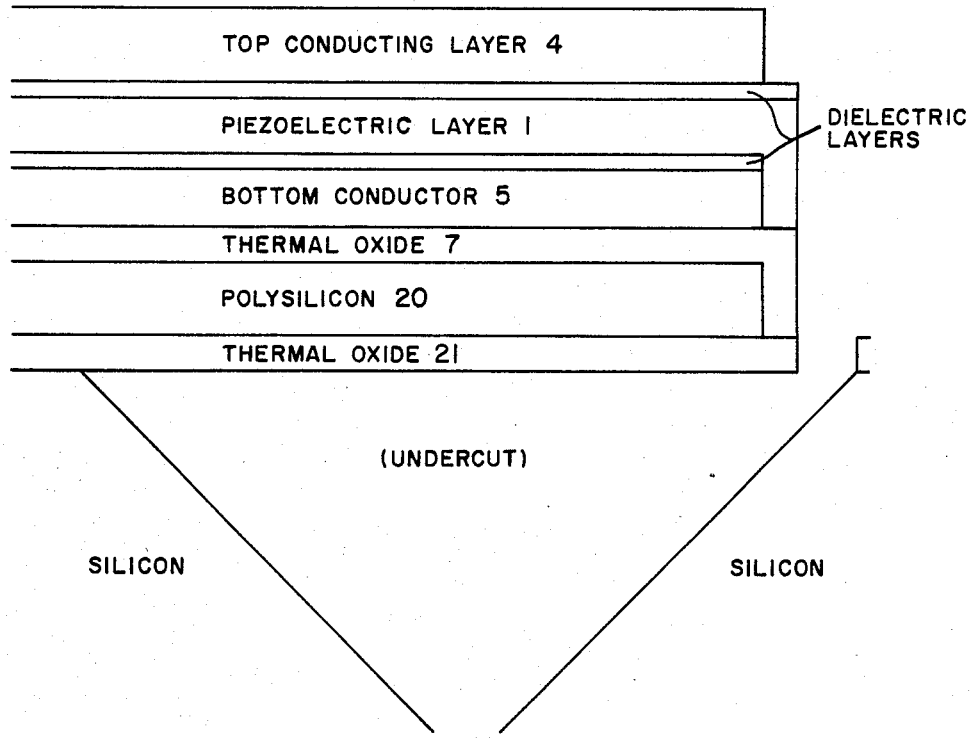
FIG. 4 is a longitudinal cross-section of a beam.
Figure 5:
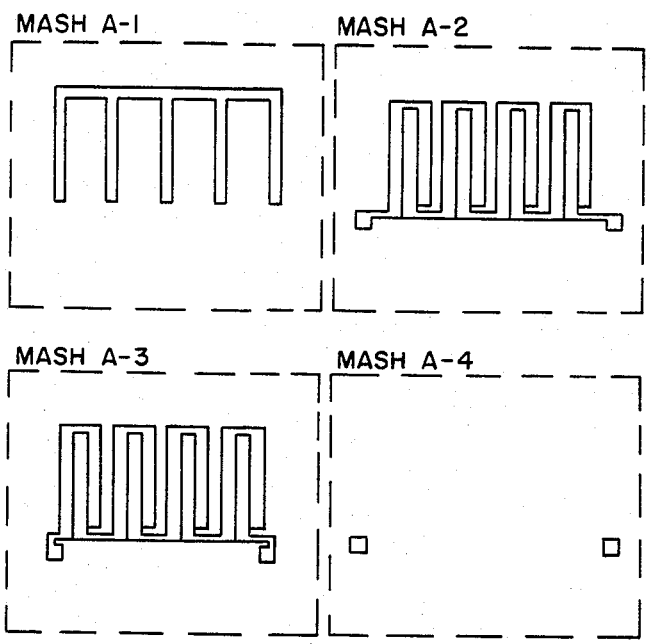
FIG. 5 shows typical masked patterns used in the present invention.

FIG. 4 shows the functional parts of a longitudinal cross-section of a beam. The vertical scale has been exaggerated to show these parts. This particular cross-section shows an additional layer of polysilicon 20 and thermal oxide 21 that gives the beam greater mechanical integrity.

Figure 7:
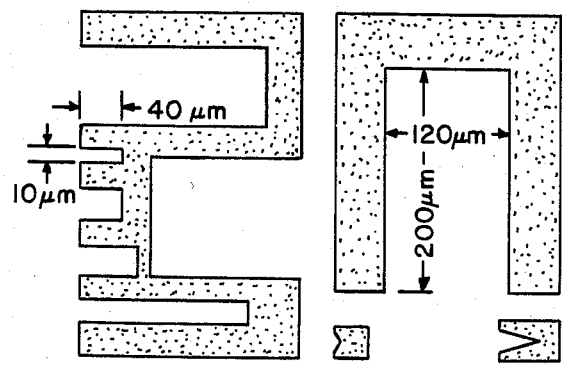
FIG. 7 illustrates a mass pattern used for the development of the etching process.

Anisotripic etchants remove silicon at different rates along different crystallographic axes. The mask pattern to be used for developing the etching process is shown in FIG. 7. This method has been used to undercut cantilever beams of silicon dioxide on silicon wafers by using an aqueous solution of ethylenediamine and pyrocatechol as the etchant.

The input signal is connected across the top and bottom conducting layers of the first section of the first plate. Electrical signal will cause a plate (or beam) to deflect, due to the strain caused by the first pattern of piezoelectric material on the plate. This strain causes a signal to be generated in the second pattern of piezoelectric material on the plate, and this generated signal is electrically connected to the first pattern of piezoelectric material on the next plate and so on down to the last plate where an output signal is extracted. The resonant frequencies of the cantilever plates can be controlled by controlling their dimensions and the piezoelectric patterns. The signal can be amplified between plates by amplifiers, not shown. The composite signal transfer characteristics of the invention can be made to be a band-pass filter with flat response in the frequency passed but with sharp attenuation outside this frequency. The frequency ranges are only limited by the attainable resonant modes for cantilever beams of the size that can be fabricated on silicon. These generally range from a few hundred hertz to a few hundred kilohertz. The device can be built into an intergrated circuit where it will act as a band-pass filter.

I claim:

1. A device comprising a plurality of cantilever plates arranged in a series format from a first plate down to a last plate; each plate containing a piezoelectric element; conducting elements on each plate sandwiching each piezoelectric element; each of the series of plates except the first plate having the conducting elements adapted to be connected to an output signal of a preceding plate; and said piezoelectric elements and said conducting elements coupling each plate in a series fashion such that the strain caused by a deflection of a preceding plate will be transfered as an electrical signal to the next plate and so on down to the last plate; all plates are all identical to each other and have a resonant frequency; whereby a signal input to the first plate at this resonant frequency will pass through the device substantially unattenuated; and a signal input to the first plate which is not at this resonant frequency will be attenuated in its passage through the device; said piezoelectric element and said conducting elements are formed from thin film continuous layers; said layers being deposited on a silicon substrate; said silicon substrate and said layers being selectively removed to produce the cantilever plates; and a further polysilicon layer sandwiched by thermal oxide layers is placed between the continuous layers and said silicon substrate so as to give greater mechanical integrity to each plate.

2. A device comprising a plurality of cantilever plates arranged in a series format from a first plate down to a last plate; each plate containing first and second piezoelectric element; conducting elements on each plate sandwiching each piezoelectric element; each of the series of plates except the first plate having the conducting elements adapted to connect the first piezoelectric element to an output signal from a second piezoelectric of a preceding plate; said first piezoelectric element of each plate causing the plate to flex and cause a strain in the second piezoelectric element; said piezoelectric elements and said conducting elements coupling each plate in a series fashion such that the strain caused by a deflection of a preceding plate will be transferred as an electrical signal to the next plate and so on down to the last plate; all plates are all identical to each other and have a resonant frequency; whereby a signal input to the first plate at this resonant frequency will pass through the device substantially unattenuated; a signal input to the first plate which is not at this resonant frequency will be attenuated in its passage through the device; said piezoelectric element and said conducting elements are formed from thin film continuous layers; said layers being deposited on a silicon substrate; said silicon substrate and said layers being selectively removed to produce the cantilever plates; and a further polysilicon layer sandwiched by thermal oxide layers is placed between the continuous layers and said silicon substrate so as to give greater mechanical integrity to each plate.

* * * * *